(12) United States Patent
Collins et al.

(10) Patent No.: US 6,706,586 B1
(45) Date of Patent: Mar. 16, 2004

(54) METHOD OF TRENCH SIDEWALL ENHANCEMENT

(75) Inventors: Christophe N. Collins, Poughkeepsie, NY (US); Rajarao Jammy, Wappingers Falls, NY (US); Brian W. Messenger, Newburgh, NY (US); Siddhartha Panda, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/279,142

(22) Filed: Oct. 23, 2002

(51) Int. Cl.$^7$ .................. H01L 21/8242; H01L 21/20
(52) U.S. Cl. ................. 438/243; 438/386; 257/301
(58) Field of Search .................. 438/243–249, 438/386–392; 257/301–305

(56) References Cited

U.S. PATENT DOCUMENTS

| | | |
|---|---|---|
| 4,131,496 A | 12/1978 | Weitzel et al. |
| 4,775,550 A | 10/1988 | Chu et al. |
| 5,258,332 A | 11/1993 | Horioka et al. |
| 5,935,874 A | 8/1999 | Kennard |
| 6,020,270 A | 2/2000 | Wong et al. |
| 6,066,566 A * | 5/2000 | Naeem et al. ............. 438/700 |
| 6,069,091 A | 5/2000 | Chang et al. |
| 6,103,635 A | 8/2000 | Chau et al. |
| 6,127,278 A | 10/2000 | Wang et al. |
| 6,165,854 A | 12/2000 | Wu |
| 6,221,784 B1 * | 4/2001 | Schmidt et al. ............. 438/719 |
| 6,303,513 B1 * | 10/2001 | Khan et al. ................. 438/714 |
| 6,387,773 B1 * | 5/2002 | Engelhardt ................. 438/386 |
| 6,544,838 B2 * | 4/2003 | Ranade et al. ............. 438/244 |

* cited by examiner

Primary Examiner—John F. Niebling
Assistant Examiner—Jennifer M. Kennedy
(74) Attorney, Agent, or Firm—Steven Capella (57) ABSTRACT

A method of fabricating a high aspect ratio deep trench having smooth sidewalls in a semiconductor substrate comprising a first etching step of contacting the substrate in which the deep trench is to be etched with either $NF_3$ gas or $SF_6$ gas in the absence of the other, followed by a second etching step with the etching gas of either $NF_3$ or $SF_6$ which ever one was not used in the first etching step, and alternating the first and second etching steps until the desired high aspect ratio trench depth is reached.

20 Claims, 6 Drawing Sheets

METHOD OF TRENCH SIDEWALL ENHANCEMENT

FIELD OF THE INVENTION

The present invention relates to semiconductor integrated circuits and, more particularly, to the fabrication of integrated circuits requiring deep trenches.

BACKGROUND OF THE INVENTION

A memory cell in an integrated circuit comprises a transistor with an associated capacitor. The capacitor consists of a pair of conductive layers separated by a dielectric material. Information or data is stored in the memory cell in the form of charge accumulated on the capacitor. As the density of integrated circuits with memory cells is increased, the area for the capacitor becomes smaller and the amount of charge it is able to accumulate is reduced. Thus, with less charge to detect, reading the information or data from the memory cell becomes more difficult.

With increasing levels of integration in semiconductor chips or dies in a wafer, such as those with a silicon substrate, greater demands are placed on the method of fabricating the semiconductor chips, such as making smooth, straight-walled deep trenches especially for use a capacitors. The deep trenches are dry etched using HBr, $O_2$, $NF_3$ and $SF_6$ as the plasma gases. However, if the only fluorinated gas is used $NF_3$ as the etching gas, the deep trench is formed with a controlled narrow profile but with zagged sidewalls which may generate crack propagation and cause merging with adjacent trenches. With increased level of integration or decreased ground rules, this cracking problem becomes even more acute. By using $SF_6$ as the only fluorinated gas in etching the trenches, shallow trenches with broad profiles are undesirably obtained but with desirable smooth sidewalls. Again, with decreasing ground rules, broad profiles can cause trench mergers and will not give the required capacitance for trench capacitor application. When $NF_3$ and $SF_6$ are used together, the etching is difficult to control and blowouts, in the substrate being etched, occur most likely due to one gas dominating over the other. Both $NF_3$ and $SF_6$ are known in the prior art and are disclosed in U.S. Pat. No. 5,935,874 as etchant gases for forming deep trenches in a substrate such as silicon. The etchant plasma of this patent with either of these fluorine containing gases mandates the use of a high percentage helium in the plasma. HBr also is known for use as an etchant gas in forming high aspect ratio, deep trenches as disclosed in U.S. Pat. No. 6,127,278 in a multi step process in which HBr and $O_2$ is used in the first step and a fluorine containing gas is added to the second step to increase the etch rate of the substrate. If desired, the patent states that a small amount of a fluorine-containing gas such as $NF_3$, $SF_6$, $SiF_4$, $Si_2F_6$ and the like can be added in a very small amount to the etchant gases in the first step. However, the patent does not state that the fluorine-containing gas must be different from the fluorine-containing gas of the second step. The first etching step deposits a passivation layer on the sidewalls of the opening and produces a taper in the sidewalls at the top of the trench. Neither of these patents nor any of the known prior art teaches how to combine $NF_3$ with $SF_6$ to obtain a controlled narrow-profiled deep trench with smooth sidewalls without a blowout of the substrate.

SUMMARY OF THE INVENTION

Accordingly, it is object of the present invention to be able to form controlled narrow-profiled deep trench with smooth sidewalls. Another object of the present invention is to use both $NF_3$ and $SF_6$ as etchants for forming a deep trench but without risking a blowout of the substrate. To achieve these and other objects, the present invention comprises etching of the deep trench by alternating these two etchant gases, one without the other. Preferably, the substrate is first etched at one or more mask openings with $NF_3$ without $SF_6$ for a period of time followed by the removal of $NF_3$ and the etching of the trench in the substrate at the one or more mask openings with $SF_6$ without the $NF_3$ for a further period of time. The alternating etching steps are repeated until the desired etch deep of the trench in the substrate is achieved. If desired, the order of the $NF_3$ and $SF_6$ etchant gases can be reversed in etching the trench. Thus, a smooth sidewalled, narrow-profiled trench is formed without any possibility of a blowout in the substrate because $NF_3$ and $SF_6$ are not combined together during etching of the trench.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

Figure 1:
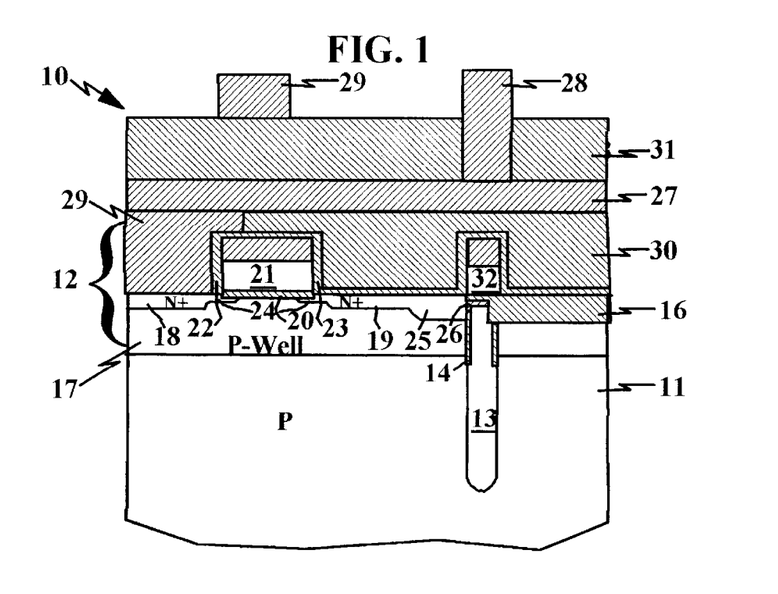
FIG. 1 is a cross-sectional view of a memory cell of an integrated circuit showing a field effect transistor (FET) and the deep trench of the present invention.

A detailed description of the present invention will now be made by referring to the accompanying drawings. As an example of one utilization of the deep trench of the present invention, FIG. 1 shows the basic parts of a memory cell 10, namely—a transistor and a capacitor, which is fabricated in and on a silicon substrate 11 and which, herein, is one cell of an array of cells of a dynamic random access memory (DRAM). Herein, the memory cell is a CMOS FET and comprises a pair of field effect transistors (FET) of which only one FET 12 is indicated by a bracket. Associated with each FET is at least one trench capacitor, which is connected to and in combination with each FET. In FIG. 1, only one capacitor 13 is shown. The capacitor 13 functions as a charge storage element and as a means for storing data in the memory cell 10. Disposed in the trench is an insulating material, such as silicon oxide, on the side walls and bottom and disposed between insulating material is a conductive material, such as doped polysilicon. At the upper segment of the deep trench capacitor, an oxide collar 14 is disposed around the periphery 15 of the trench and abuts a shallow trench isolation (STI) area 16 on side of the trench 13 opposite the FET 12. Herein, the FET 12 includes a P-Well 17, a N+ source region 18 and a N+ drain region 19 in the silicon substrate 11 on opposite sides of a gate oxide 20 on and in the substrate 11 underlying a gate electrode 21 comprising doped polysilicon and a refractive metal. Insulating sidewalls 22 and 23 are disposed on the gate electrode 21 and were formed after the implantation of the N–f impurities adjacent the gate electrode, which created lightly doped drain (LDD) regions 24. The sidewalls 22 and 23 provide a mask for implanting the N+ impurities of the source and drain regions, 18 and 19, respectively. At the same time as the gate electrode 21 is formed, a conductive layer of doped polysilicon and refractive metal is disposed over and insulated from the trench by the STI 16 to provide a pass over wordline 32.

Means for physically and electrically connecting the trench capacitor 13 to the FET comprises a deeper N+ region or strap 25 which is disposed in the drain region 19 as shown in FIG. 1. A conductive interposer 26 is positioned at the top of the trench 13 above the oxide collar 14 and abuts the N+ region or strap 25. To interface with other memory cells in the memory array, a bitline 27 extends above the gate electrode 21. Contact 28 is connected to the gate electrode 21 through a path not shown. Contact 29 is connected to the source 18 through a path not shown. Insulating layers 30 and 31 separate the contacts from the bitline and wordline contacts. The wordline, shown as the pass over wordline 32, is part of the memory array and, through the interaction of the bitline 27 and the wordline, the capacitor of the present invention is charged and discharged in the writing and reading data into and out of the memory cell shown in FIG. 1. Another FET (not shown) and trench(es) (not shown) may be included in the memory cell adjacent the FET 12. In addition, additional trenches may be included adjacent the trench 13.

Figure 2:
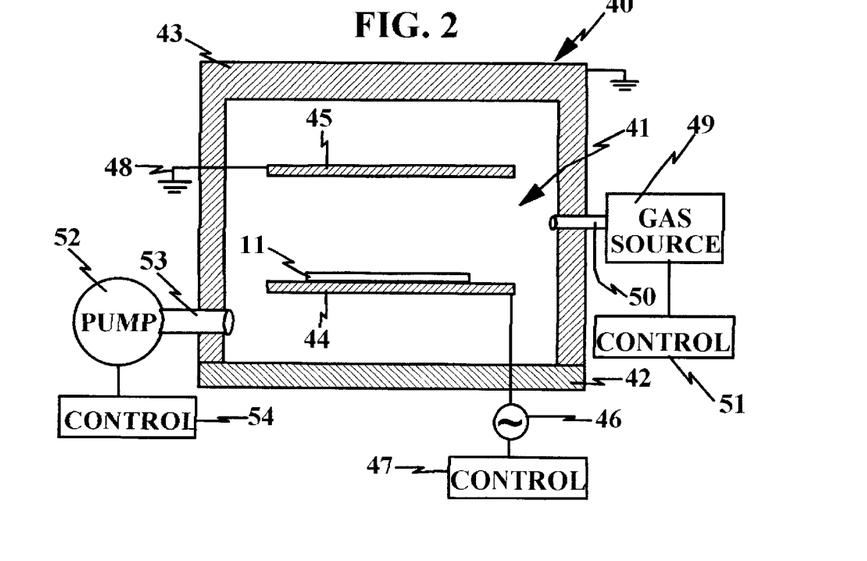
FIG. 2 is cross-sectional view of a conventional reactive ion etcher apparatus used in etching the deep trench of the present invention.

Referring now to FIG. 2, there is shown a plasma reactor for etching the high aspect deep trench(es). The plasma reactor or reactive ion etcher 40 includes a reactor chamber 41 formed by a insulated base 42 and a grounded conductive enclosure 43. The reactor 40 includes a pair of parallel plates 44 and 45 with the plate 44 connected to a power source 46 with a control apparatus 47 and the plate 45 which is connected to ground 48. The semiconductor wafer 11 is mounted on the plate 44 for etching of the deep trench. To create the plasma, a gas source 49 and a gas inlet 50, which is shown as single inlet but can be a plurality of inlets disposed around the chamber 41, provide the gas or gases to the chamber. The gases can be mixed in desired proportions and/or changed in concentration by an control apparatus 51 connected to the gas source. One gas also can be replace for another, such as $NF_3$ can be replaced by $SF_6$ and $NF_3$ can be substituted for $SF_6$. To regulate the pressure of the chamber 41, a pump 52 with an inlet 53 connected to the chamber and the pump is controlled by control apparatus 54. During etching of a high aspect deep trench(es) in the wafer 11, an etchant gas (or gases) flows through the inlet 53 to the chamber 41 with the RF power source 46 turned on. Preferably, the power source 46 ranges from 1200 to 1500 watts and herein is set at about 1300 watts at a frequency of 13.56 megahertz by the control apparatus 47. In accordance with the present invention, the power source 46 is regulated by the control apparatus 47 during etching of the trench(es). During etching, the initial pressure is preferably about 150 millitorr but can be range from 100 to 200 millitorr and be as high as 500 millitorr. The pressure also is regulated during etching of the trench(es) by control apparatus 54 of the pump 52.

Figure 3:
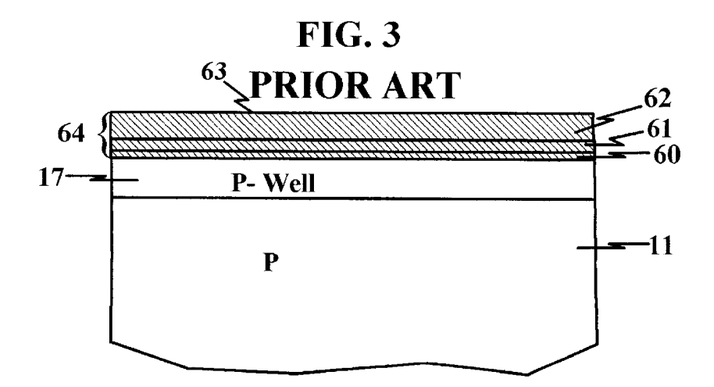
FIG. 3 is a cross sectional view of a partial semiconductor wafer with a hard mask used in the prior art for etching a deep trench in the semiconductor wafer.
Figure 4:
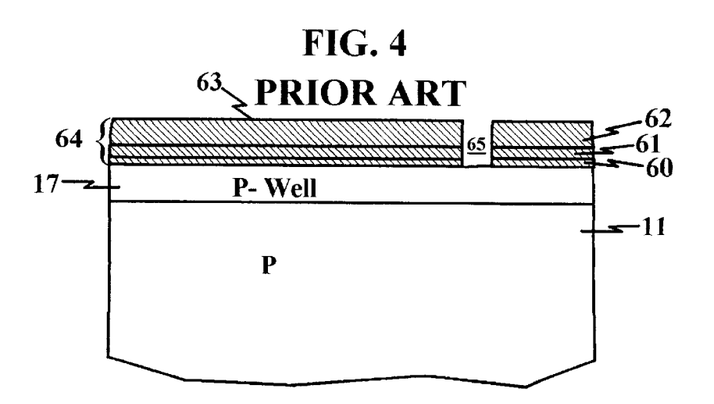
FIG. 4 is a cross sectional view of the partial semiconductor wafer of FIG. 3 with an opening etched in the hard mask to the surface of the semiconductor wafer.

Turning now to FIGS. 3–12, the silicon wafer 11, herein P doped and with a P-well 17 for the fabrication of a CMOS, is formed with a hard mask 64 which preferably comprises a layer of a pad silicon oxide 60, a layer of silicon nitride 61 thereon, and, as the top layer, a layer of BSG/TEOS (borosilicate glass/tetraethyloxysilicate) 62, with a top surface 63, as shown in FIG. 3. The oxide layer 60 is thermally grown while the nitride layer 61 and the BSG/TEOS are chemically vapor deposited as is well know in the art. Preferably, the BSG/TEOS is one micron thick because, being the top layer of the hard mask, it will be eroded during etching. A photoresist (not shown) is deposited on the BSG/TEOS and exposed and developed to create one or more trench openings in the photoresist for etching openings in the hard mask 64 to the surface of the wafer or substrate 11. The hard mask 64 is plasma etched in an anisotropic manner using the reactive ion etcher (RIE) 40 (FIG. 2) for etching the hard mask in the opening(s) formed in the photoresist with the appropriate plasma gases as known in the prior art to form mask opening(s) 65 as shown in FIG. 4.

Figure 5:
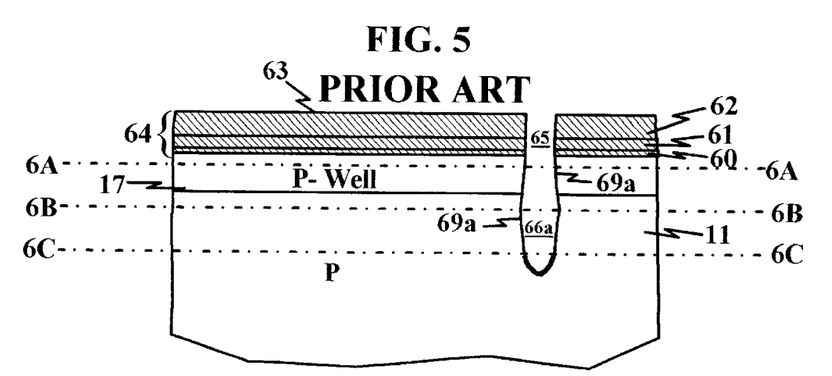
FIG. 5. is a cross sectional view of the partial semiconductor wafer of FIG. 3 showing a deep trench formed by etching with only a first prior art gas composition.
Figure 6A:
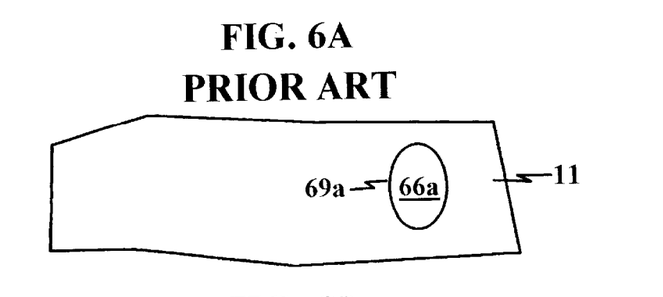
FIGS. 6A, 6B and 6C are enlarged top views taken along cross sectional lines 6A—6A, 6B—6B and 6C—6C of FIG. 5 showing those sections of the profile of the trench in the semiconductor wafer when etching with only the first prior art gas composition.
Figure 6B:
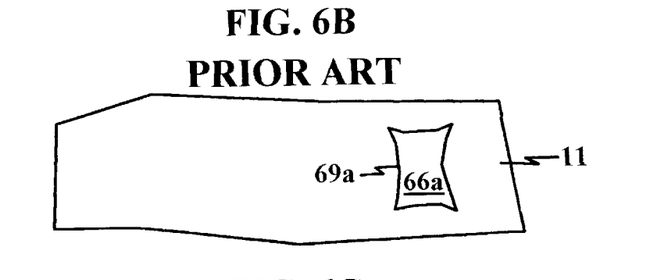
Figure 6C:
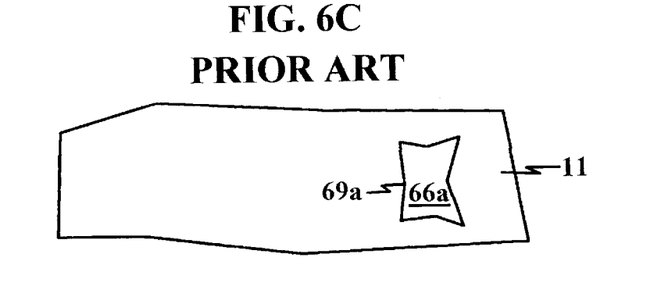

As a prior art comparison with the formation of a deep trench of the present invention, a deep trench is formed in the semiconductor substrate 11 by using the mask opening 64 of FIG. 4 and a first prior art etchant gas composition containing $NF_3$. As shown in FIG. 5, a deep trench 66a is formed but the profile is not continuous because the sidewalls 69a are not smooth. As better shown in FIGS. 6A–6C, especially FIG. 6B, the sidewalls 69a are jagged in the middle section of the trench as identified by dashed line 6B—6B of FIG. 5, which may lead to crack propagation and, if there is an adjacent trench, trench merging may result. As the ground rules of the integrated circuit decreases, these jagged sidewalls 69a become a critical problem. The prior art gas composition includes, in addition to $NF_3$, oxygen along with hydrogen bromide (HBr) and the substrate 11, herein silicon, is etched in an anisotropic manner using RIE apparatus described in conjunction with FIG. 2. This $NF_3$ fluorine gas is advantageous because it etches a deep trench with a narrow profile. However, the jagged sidewalls 69a can not be tolerated.

Figure 7:
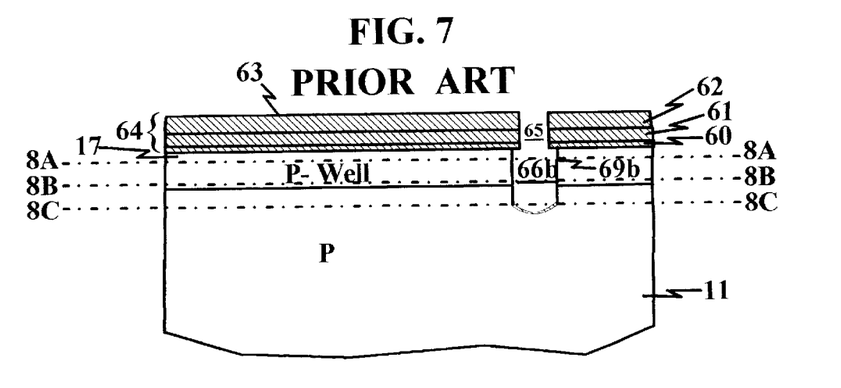
FIG. 7 is a cross sectional view of the semiconductor wafer of FIG. 3 showing a deep trench formed by etching with only a second prior art gas composition.
Figure 8A:
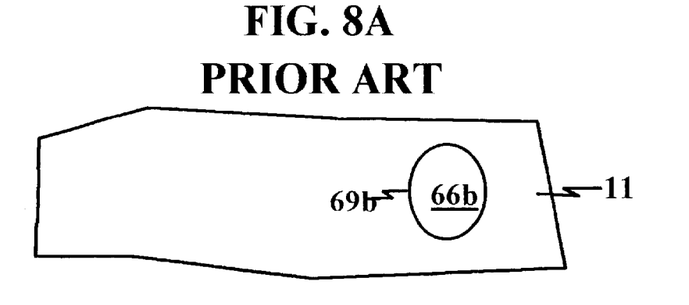
FIGS. 8A, 8B and 8C are enlarged top views taken along cross sectional lines 8A—8A, 8B—8B and 8C—8C of FIG. 7 showing those sections of the profile of the trench in the semiconductor wafer when etching with only the second prior art gas composition.
Figure 8B:
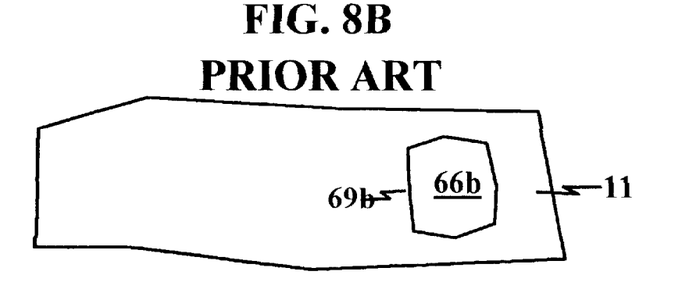
Figure 8C:
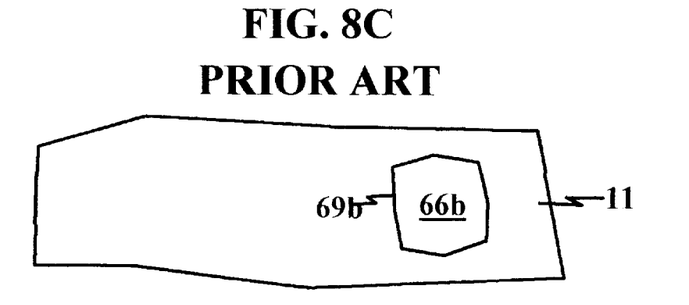
Figure 9:
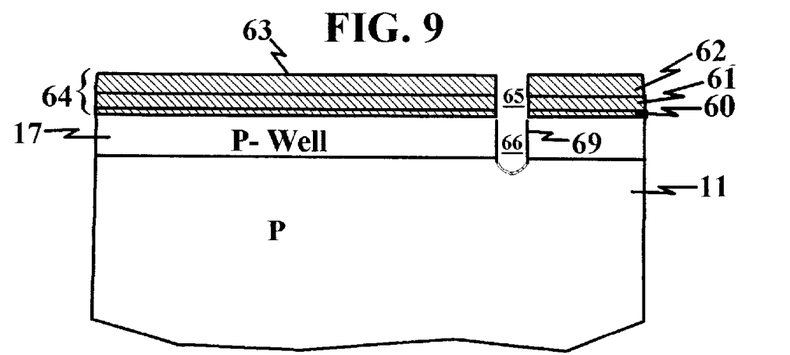
FIGS. 9, 10, 11 and 12 are cross sectional views of the partial semiconductor wafer of FIG. 3 showing a deep trench formed by etching with the gas compositions and method of the present invention.
Figure 10:
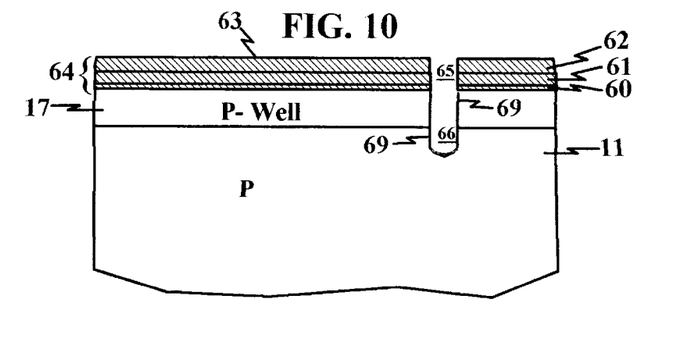
Figure 11:
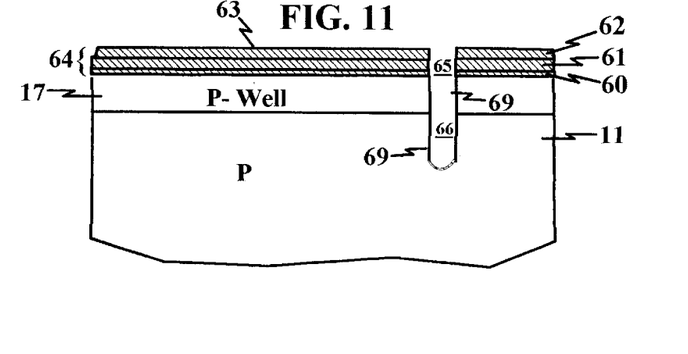
Figure 12:
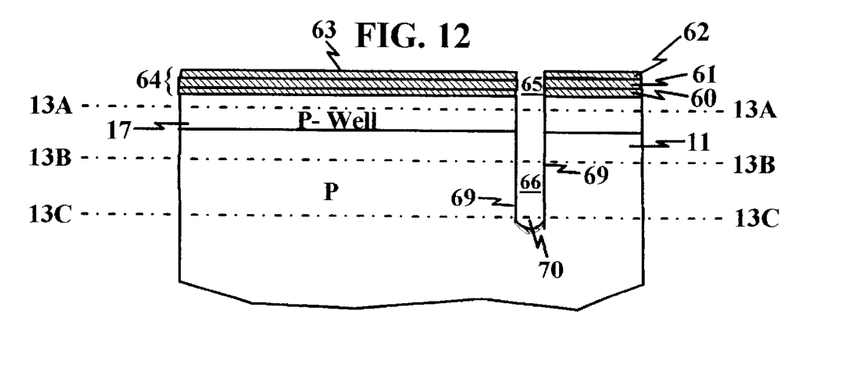

As a further prior art comparison with the formation of a deep trench of the present invention, a deep trench is formed in the semiconductor substrate 11, herein silicon, by using the mask opening 64 of FIG. 4 and a second prior art etchant gas composition containing $SF_6$. This second prior art gas composition also includes, in addition to $SF_6$, oxygen along with hydrogen bromide (HBr) and the silicon substrate is etched in an anisotropic manner using RIE apparatus described in conjunction with FIG. 2. As shown in FIG. 7, the profile of the etched trench 66b is wide relative to the mask opening and is not as deep as the trench formed with the first prior art gas composition. However, $SF_6$ does etch a trench with a smooth sidewalls 69b as best shown in FIGS. 8A–8C, especially FIG. 8B, but the wide profile and the shallowness of the trench are major disadvantages to forming a deep trench. In addition, it has been found that the combination of the first prior art gas composition of $NF_3$ with the second prior art gas of $SF_6$ is dangerous and destructive because the reactive ion etching reaction with the combination of these two fluorine containing etchant gases is difficult to control and blow outs occur which totally ruin the trench structure.

In accordance with the present invention, a smooth sidewalled, narrow, deep trench 66 as shown in FIGS. 9–12 is formed by alternating the two prior art gases during the etching of the trench to take advantage of the narrow profile and deep trench etching obtained with $NF_3$ and the smooth sidewalls 69 obtained with $SF_6$. Preferably, the $NF_3$ is first supplied to the plasma chamber 41 of the reactive ion etcher 40 and the opening(s) 65 to the substrate 11 in the hard mask 64 for a short period, followed by $SF_6$ being supplied to the chamber 41, after $NF_3$ has been removed. Again, $SF_6$ contacts the substrate 11 for only a short period before being removed and replaced with $NF_3$, followed by the replacement of $NF_3$ with $SF_6$. By keeping $NF_3$ and $SF_6$ separate in alternating etching steps, there is no chance of a blowout during the etching of the trench. Depending on the desired depth of the trench, preferably with a high aspect ratio of about 40 or more, this cycle of $NF_3$ and $SF_6$ etching is continued until that desired depth or bottom 70 (FIG. 12) is reached. For example, if a depth trench of about 6 to about 8 $\mu$m is desired with width and length dimensions in the range of about 0.08 $\mu$m to about 0.2 $\mu$m and about 0.15 $\mu$m to about 0.4 $\mu$m, respectively, in a silicon substrate, about four (4) to about ten (10) cycles would be required for about two (2) to about four (4) minutes for each cycle. The preferred width and length dimensions are about 0.15 $\mu$m and about 0.4 $\mu$m, respectively. Although the preferred sequence of the fluorine containing gases is $NF_3$ followed by $SF_6$, it must be understood this sequence can be reversed with $SF_6$ being the first fluorine containing etchant gas followed by $NF_3$.

Preferably, during alternative etching with $NF_3$ and $SF_6$, the plasma gas mixture is either $NF_3$/HBr/$O_2$ or $SF_6$/HBr/$O_2$. The presence of HBr causes a physical etch of the silicon substrate in contrast to a chemical etch by $NF_3$ and $SF_6$. In addition, as previously stated, the time of each etching step, the pressure, and the power can range from about 2 to about 4 minutes, from about 100 to about 500 milliTorr, and from about 1200 to about 1500 Watts, respectively. The gas flow per minute is measured in "sccm" and, herein, the $NF_3$ fluorine containing gas can range from about 5 to about 20 sccm when it is present for etching and 0 when it is not, and the $SF_6$ fluorine containing gas can range from about 5 to about 12 sccm when it is present for etching and 0 when it is not. The range of HBr with $NF_3$ is about 150 sccm to about 250 sccm and with $SF_6$ is about 150 to about 250 sccm. The range of $O_2$ with $NF_3$ is about 6 sccm to about 20 sccm and with $SF_6$ is about 6 to about 20 sccm. The following table is an example of etching a deep, narrow, high aspect ratio deep trench with smooth sidewalls by using the method and gas compositions of the present invention:

| Step | a | b | c | d |
|---|---|---|---|---|
| Time (min) | 2:00 | 2:00 | 2:00 | 2:00 |
| Pressure (mTorr) | 150 | 150 | 150 | 150 |
| Power (Watt) | 1300 | 1300 | 1300 | 1300 |
| NBr (sccm) | 175 | 175 | 175 | 175 |
| $NF_3$ (sccm) | 0 | 18 | 0 | 18 |
| $O_2$ (sccm) | 11 | 9 | 11 | 9 |
| $SF_6$ (sccm) | 8 | 0 | 8 | 0 |

Figure 13A:
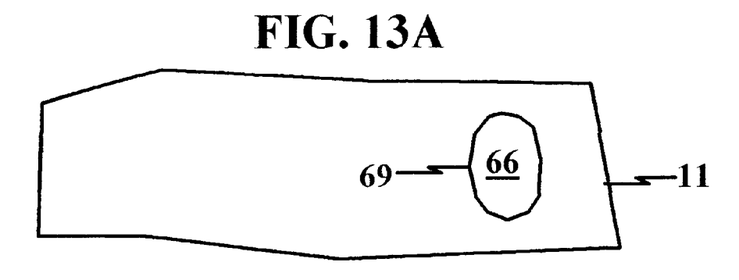
FIGS. 13A, 13B and 13C are enlarged top views taken along cross sectional lines 13A—13A, 13B—13B and 13C—13C of FIG. 12 showing the sections of the profile of the trench in the semiconductor wafer when the gas compositions and method of the present invention is used.
Figure 13B:
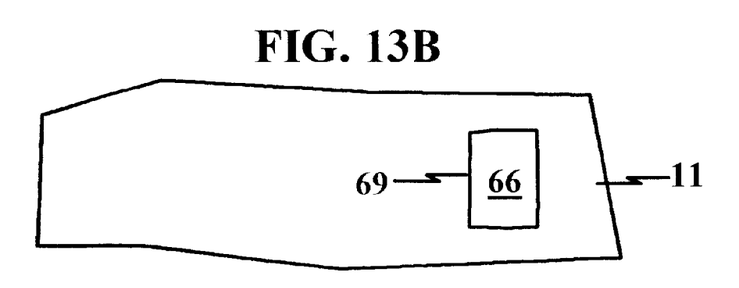
Figure 13C:
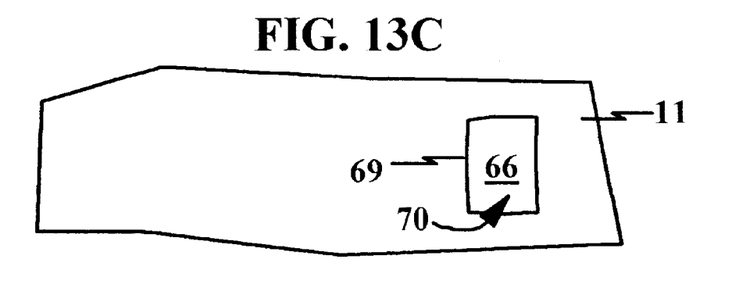

It will be noted from the above Table that, in Steps a and c, $NF_3$ is the only fluorine containing gas whereas in steps b and d, $SF_6$ is the only fluorine containing gas. The trench 66 during etching is shown in FIGS. 9–12 with the depth of the trench increasing with each alternating step, especially with the $NF_3$ etching steps. The resulting trench 66 at the end of the etching method of the present invention was 6.2 $\mu$m deep with an aspect ratio of 41. The profiles of the trench 66 are shown in FIGS. 13A (top section), 13B (middle section) and 13C (bottom section) as indicated by the cross-sectional lines 13A—13A, 13B—13B and 13C—13C of FIG. 12. It will be noted that the trench is narrow in FIGS. 9–12 and the sidewalls of the trench are smooth as shown by FIGS. 13A–13C.

The FIGs. related to the etching steps of the present invention do not show the reduced thickness of the BSG/TEOS layer 62 which occurs during the etching of the trench. It is desired not to reach the silicon nitride layer 61 in etching the trench(es) 66 and etching is normally stopped after 0.9 $\mu$m of the BSG/TEOS has been eroded from the beginning thickness of 1 $\mu$m. If difference thickness of BSG/TEOS are used, it is desired to stop when 0.1 $\mu$m of the BSG/TEOS remains.

Although this invention has been described relative to particular embodiments, it will be apparent to those skilled in the art that various changes and modification may be made without departing from the spirit and scope of the inventions defined in the following claims.

What is claimed is:

1. A method of fabricating an integrated circuit requiring at least one deep trench in a semiconductor substrate comprising the steps of:

providing a semiconductor substrate having an upper surface with a mask layer having an opening to the substrate;

contacting said mask opening with a first etchant composition comprising a first fluoride selected from the group consisting of $NF_3$ and $SF_6$ for a time under reactive ion etching conditions of pressure and power whereby a portion of said substrate is etched at said mask opening, only one of the two fluorides being present in the composition;

contacting said mask opening, in the absence of said first fluoride, with a different etchant composition comprising a second fluoride selected from the group consisting of $NF_3$ and $SF_6$ for a time under reactive ion etching conditions of pressure and power whereby an additional portion of said substrate is etched at said mask opening;

repeating contacting the mask opening by cycling said first and second etchant compositions alternatively for at least two cycles until the desired trench depth in said substrate is reached.

2. The method of claim 1 wherein the first fluorine containing etchant gas is $NF_3$ and the second fluorine containing etchant gas is $SF_6$.

3. The method of claim 1 wherein the first fluorine containing etchant gas is $SF_6$ and the second fluorine containing etchant gas is $NF_3$.

4. The method of claim 1 wherein one of said etchant compositions also include HBr and $O_2$.

5. The method of claim 1 wherein the time of contacting said mask opening is in the range of about 2 to about 4 minutes for said first fluoride and in the range of about 2 to about 4 minutes for said second fluoride.

6. The method of claim 1 wherein, during etching, $NF_3$ is in the range of about 5 to about 20 sccm.

7. The method of claim 1 wherein, during etching, $SF_6$ is in the range of about 5 to about 12 sccm.

8. The method of claim 4 wherein, during etching, the range of HBr with $NF_3$ is about 150 sccm to about 250 sccm and with $SF_6$ is about 150 to about 250 sccm.

9. The method of claim 4 wherein, during etching, the range of $O_2$ with NF 3 is about 6 sccm to about 20 sccm and with $SF_6$ is about 6 to about 20 sccm.

10. The method of claim 1 wherein the pressure of said reactive ion etching conditions ranges from about 100 to about 200 milli Torr.

11. The method of claim 1 wherein the power of said reactive ion etching conditions range from about 1200 to about 1500 Watts.

12. The method of claim 1 wherein said depth is in the range of about 6 to about 8 $\mu$m.

13. The method of claim 12 wherein the number of cycles is in the range of about four to about ten cycles.

14. The method of claim 13 wherein the amount of time is about two to about four minutes for each cycle.

15. In a method of fabricating an integrated circuit requiring at least one deep trench having an aspect ratio of 40 or more and smooth sidewalls in a semiconductor substrate comprising the steps of:

forming a mask layer with at least one opening on the upper surface of said semiconductor substrate;

contacting said semiconductor substrate through said mask opening with a first etchant composition comprising a first fluoride selected from the group consisting of $NF_3$ and $SF_6$ for a time under reactive ion etching conditions of pressure and power whereby a portion of said substrate is etched through said mask opening, only one of the two fluorides being present in the composition;

contacting said semiconductor substrate through said mask opening, in the absence of said first fluoride, with an etchant composition comprising a second fluoride selected from the group consisting of $NF_3$ and $SF_6$ for a time under reactive ion etching conditions of pressure and power whereby an additional portion of said substrate is etched through said mask opening;

repeating contacting said semiconductor substrate through said mask opening with said first and second etchant compositions alternatively for at least two cycles until the desired trench depth with an aspect ratio of 40 or more and with smooth sidewalls in said substrate is reached.

16. The method of claim 1 wherein the first fluorine containing etchant gas is $NF_3$ and the second fluorine containing etchant gas is $SF_6$.

17. The method of claim 1 wherein the first fluorine containing etchant gas is $SF_6$ and the second fluorine containing etchant gas is $NF_3$.

18. The method of claim 1 wherein the time of contacting said mask opening is in the range of about 2 to about 4 minutes for said first fluoride and in the range of about 2 to about 4 minutes for said second fluoride.

19. The method of claim 1 wherein, during etching, $NF_3$ is in the range of about 5 to about 20 sccm.

20. The method of claim 1 wherein, during etching, $SF_6$ is in the range of about 5 to about 12 sccm.

* * * * *